United States Patent
Ladewig et al.

(10) Patent No.: US 8,084,686 B2
(45) Date of Patent: Dec. 27, 2011

(54) STACKABLE POWER DISTRIBUTION BOX

(75) Inventors: Christopher Ladewig, Fayetteville, GA (US); Matthew William Conger, East Point, GA (US)

(73) Assignee: Cooper Technologies Company, Houston, TX (US)

(*) Notice: Subject to any disclaimer, the term of this patent is extended or adjusted under 35 U.S.C. 154(b) by 147 days.

(21) Appl. No.: 12/474,905

(22) Filed: May 29, 2009

(65) Prior Publication Data
US 2010/0300721 A1 Dec. 2, 2010

(51) Int. Cl.
*H05K 5/04* (2006.01)
(52) U.S. Cl. ............ 174/50; 174/58; 439/535; 248/906
(58) Field of Classification Search .......... 174/50, 174/58; 439/535; 248/906; 220/4.02
See application file for complete search history.

(56) References Cited

U.S. PATENT DOCUMENTS

| | | |
|---|---|---|
| D187,025 S | 1/1960 | Pastor |
| D269,760 S | 7/1983 | Geney |
| 4,503,812 A | 3/1985 | Eberhardt |
| D279,283 S | 6/1985 | Tate |
| D283,560 S | 4/1986 | Uchin |
| 6,007,353 A | 12/1999 | Webster |
| 6,115,236 A | 9/2000 | Jedlitschka et al. |
| 6,186,468 B1 | 2/2001 | Schlegal |
| D453,143 S | 1/2002 | Jones |
| D488,128 S | 4/2004 | Ho |
| D513,492 S | 1/2006 | Redfield |
| D539,291 S | 3/2007 | Li et al. |
| D547,262 S | 7/2007 | Ullman |
| D580,860 S | 11/2008 | Xi-Ren |
| D609,182 S | 2/2010 | Ladewig et al. |
| 7,817,405 B2 * | 10/2010 | Neumann et al. ............ 361/625 |

OTHER PUBLICATIONS http://www.gen-tran.com/assets/pdfs/PowerWebRelease.pdf; Sep. 24, 2007.
http://www.hubbellcatalog.com/wiring/catalogpages/section-s.pdf.
X-Treme Box Product Bulletin; Coleman Cable, Inc.; Jul. 1, 2008.
http://ericson.thomasnet.com/viewitems/power-distribution-centers/-series-oscar-temporary-power-distribution-centers?&forward=1.
http://www.northerntool.com/webapp/wcs/stores/servlet/product_6970_200323702_200323702.

* cited by examiner

*Primary Examiner* — Dhirubhai R Patel
(74) *Attorney, Agent, or Firm* — King & Spalding LLP

(57) ABSTRACT

The power box can be stacked while limiting horizontal translation. The power box includes an electrical component box, a cover for the electrical component box, and a support assembly. The support assembly has feet that raise the electrical component box off of the ground. The cover includes one or more raised projections that restrict the horizontal translation of a power box positioned thereon, by dimensioning the projections apart by a distance slightly greater than an exterior width of the support assembly of the power box that rests upon the cover. Horizontal translation is further limited by dimensioning the feet such that, when placed on top of another power box, the interior dimension between two feet is slighting greater than the dimension of the cover. So, when the top power box attempts to slide, the feet of the top power box contact the cover of the bottom power box.

16 Claims, 7 Drawing Sheets

STACKABLE POWER DISTRIBUTION BOX

FIELD OF THE INVENTION

The present invention relates generally to portable power distribution boxes. More specifically, the present invention relates to a portable power distribution box with leg supports that allows for the stacking of multiple boxes together while limiting horizontal translation.

BACKGROUND OF THE INVENTION

Portable power distribution boxes (hereinafter "power boxes") are typically used at construction sites to provide multiple receptacles for receiving plugs from and providing power to the variety of tools used on a construction site. The advantage of the power box is that it is able to receive power from a single source and supply that power to multiple devices. The power boxes can even be designed to provide power at multiple voltages, frequencies, and/or currents from the same box.

For a large scale construction project, the construction site typically has many power boxes in use at a single time. Several techniques have been developed to transport the power boxes to and around the site. Some power boxes include handles or wheels. However, due to the weight typically associated with the power boxes, the terrain at the site, and typical site conditions, manually moving these boxes all but a short distance is generally disfavored. Another way to move the power boxes around the site is through the use of a forklift or other similar vehicle. However, when the power boxes are stacked on top of one another, they are not stable enough to move around without banding or using plastic wrap to hold the boxes together. This results in the forklift having to take one power box at a time to the desired location, ultimately resulting in more trips than would be necessary if the boxes could be safely stacked together.

The problem is the same when the boxes are not in use and need to be put in storage. Conventional large scale power boxes are individually banded to their own pallet, which typically cannot be stacked. This results in the power boxes taking up an inordinate amount of storage space. Accordingly, a need exists in the art for a portable power box that is capable of being stacked with other power boxes during transportation and storage that limits or prevents horizontal movement of the power box in the stacked position.

SUMMARY OF THE INVENTION

The present invention relates generally to a support assembly that facilitates use and storage of a power distribution box. The support assembly is dimensioned to interact with the electrical component box coupled to the support assembly and a separate electrical component box with a support assembly when stacked vertically as described herein.

For one aspect of the present invention, the power distribution box can include an electrical component box, a multiple feet coupled to the electrical component box, and a cover. The electrical component box can include a top side defined by an opening, and a bottom side. The electrical component box can also be defined by a first and a second horizontal dimension. The feet can typically be coupled to the bottom side of the electrical component box. At least a portion of the feet extend below the bottom side of the electrical component box. The cover can include a top surface, a bottom surface, and multiple projections extending up from the top surface. Typically, at least two of the projections are spaced apart a first distance such that the first distance is greater than either the first dimension or the second dimension of the electrical component box.

For another aspect of the present invention, a power distribution box can include an electrical component box and a support assembly coupled to the electrical component box. The electrical component box can include a cover having a top and bottom surface and multiple projections extending up from the top surface. The box can also include multiple substantially vertical walls extending down from the top surface and a bottom side coupled to the vertically walls, such that the cover, walls and bottom side define the interior of the box. The support assembly has horizontal longitudinal and latitudinal dimensions and includes a top side, a bottom side and multiple feet extending down from the bottom side. At least two of the projections on the cover can be spaced apart a first distance, such that the first distance is greater than or equal to the latitudinal dimension of the support assembly.

For yet another aspect of the present invention, a method of stacking a second power distribution box vertically on top of a first power distribution box include providing two power distribution boxes as substantially described herein. The first power distribution box is positioned on a surface, such as a floor or pallet. The second power distribution box is turned about ninety degrees offset from the first box and placed on top of the first box, such that part of the support assembly of the second box rests on the top surface of the cover of the first box and is positioned between at least two projections that are spaced apart a first distance. The projections can substantially prevent horizontal movement if a first direction by the second box by causing the support assembly to contact one or more projections when the second box tries to slide in the first direction.

These and other aspects, objects, and embodiments of the present invention will become apparent to those having ordinary skill in the are upon consideration of the following detailed description of illustrative embodiments exemplifying the best mode for carrying out the invention as presently perceived.

BRIEF DESCRIPTION OF THE DRAWINGS

For a complete understanding of the present invention and the advantages thereof, reference is now made to the following description in conjunction with accompanying figures in which.

The appended drawings illustrate only exemplary embodiments of this invention and are therefore not to be considered limiting of its scope, as the invention may admit to other equally effective embodiments.

DETAILED DESCRIPTION OF THE EXEMPLARY EMBODIMENTS

The present invention provides a support assembly to be used to provide support to a power box and facilitate storage thereof. Exemplary embodiments of the present invention can be more readily understood by reference to the exemplary figures, in which like numerals represent like elements throughout. It should be understood that, although exemplary embodiments of the invention are illustrated below, the present invention may be practiced using any number of techniques, whether currently known or in existence. The present invention should in no way be limited to the exemplary implementations, drawings, and techniques illustrated below, including the exemplary design and implementation illustrated and described herein. Furthermore, any spatial references herein such as, for example, "dorsal", "ventral", "top," "bottom," "upper," "lower," "above," "below," "rear," "between," "vertical," "angular," "beneath," etc., are for the purpose of illustration only and do not limit the specific orientation or location of the described structure.

Referring now to the figures, in which like numerals represent like elements throughout the figures, aspects of the exemplary embodiments will be described. Several terms are used throughout the detailed description. "Surface" generally means any location the power box may rest on, such as the ground or another power box. "Nest" generally refers to the ability of multiple objects to fit together compactly as described below.

Figure 1:
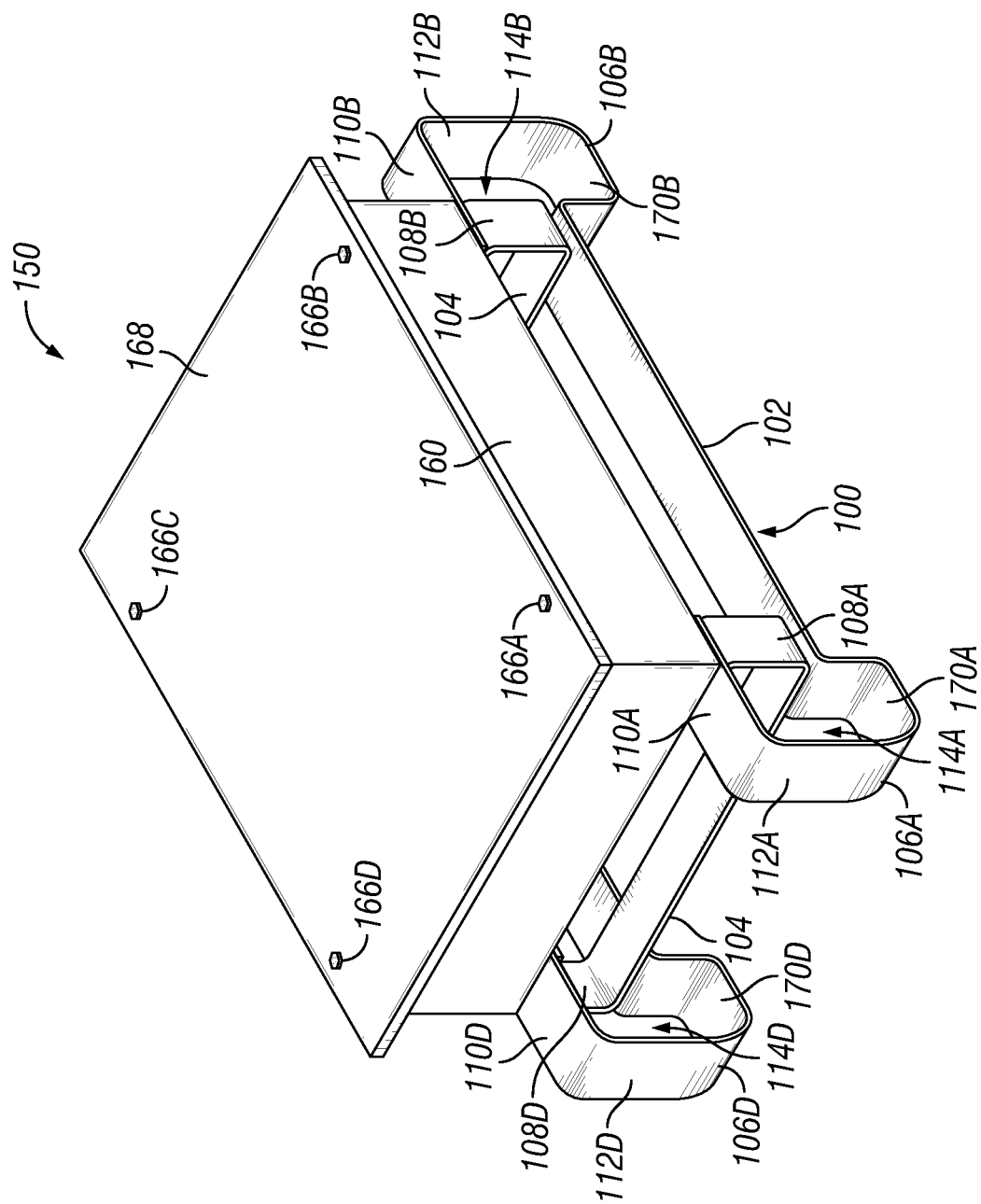
FIG. 1 is a perspective view of a power box utilizing a support assembly according to one exemplary embodiment of the present invention.
Figure 3:
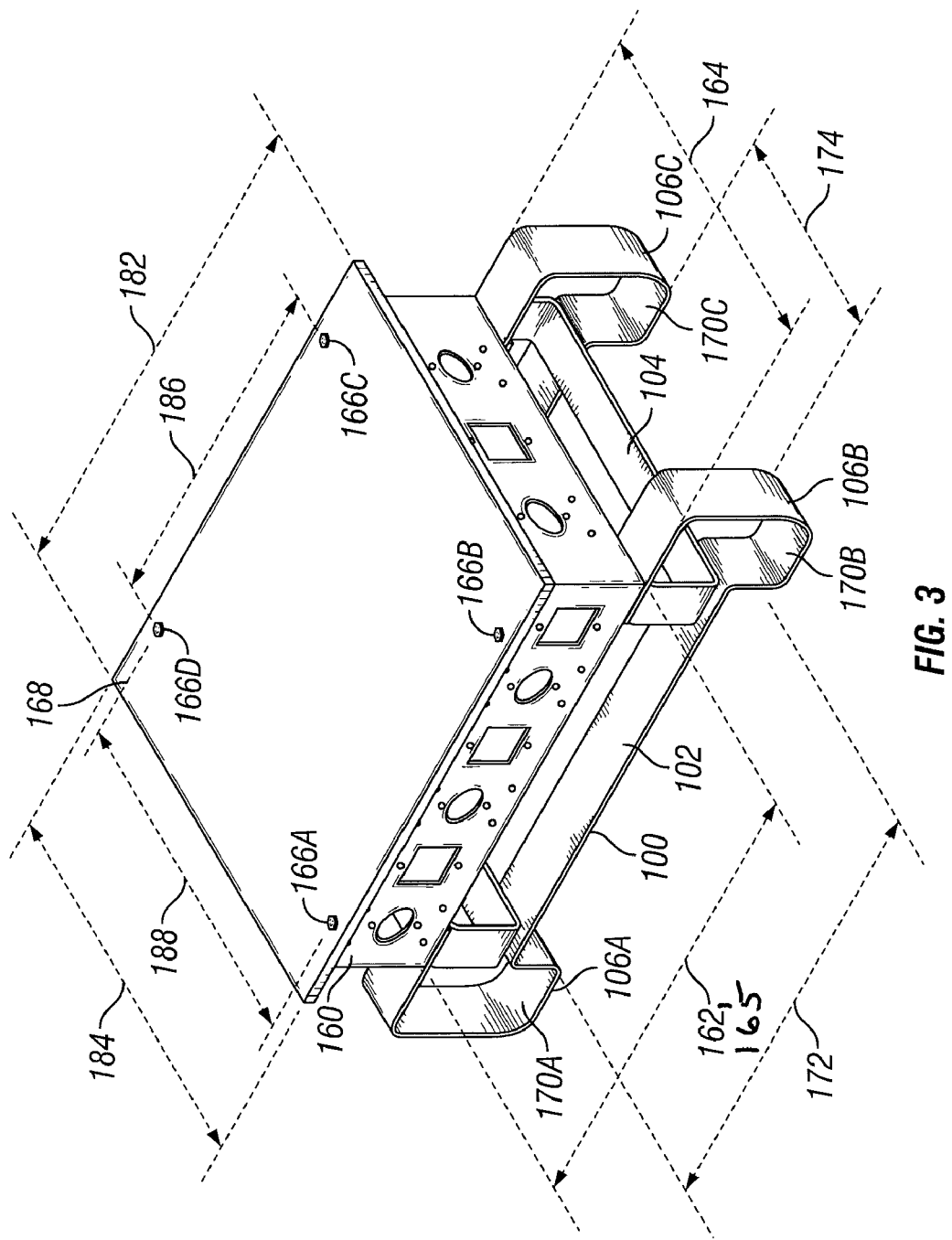
FIG. 3 is another perspective view of the power box of FIG. 1 according to one exemplary embodiment of the present invention.

FIG. 3 is a perspective view of the power box 150 according to the exemplary embodiment of FIG. 1. Referring now to FIG. 3, the cover 168 has a longitudinal dimension 182 and a latitudinal dimension 184. The support assembly 100 has longitudinal dimension (also referred to herein as a horizontal longitudinal dimension) 162 corresponding to the length of the corresponding horizontal longitudinal support 102 and latitudinal dimension (also referred to herein as a horizontal latitudinal dimension) 164 corresponding to the length of the corresponding horizontal latitudinal support 104. The distance from the outer edge of horizontal longitudinal support 102a to the outer edge of the horizontal longitudinal support 102b is the outer width 164. In an alternative embodiment where the support assembly 100 does not include the horizontal longitudinal and latitudinal supports 102 and 104, the outer width (also referred to herein as the second horizontal dimension) 164 is the distance between opposing longitudinal edges of the electrical component box 160. The opposing and longitudinal dimension of the electrical component box 160 is shown and referred to as the first horizontal dimension 165. The longitudinal dimension of the innermost boundary of the feet 170a-b of the vertical members 106a-b from end-to-end is represented by 172. The latitudinal dimension of the innermost boundary of the feet 170b-c from end-to-end is represented by 174.

The power box 150 includes a cover 168 and an electrical component box 160. The cover 168 includes one or more projections 166a-d, each extending up from the top of the cover 168. In one exemplary embodiment, the cover 168 includes four projections 166a-d; however, greater or fewer numbers of projections 166a-d are contemplated within the scope of the present invention. In certain exemplary embodiments, the projections 166a-d are fasteners that fix the cover 168 to the electrical component box 160. In alternative exemplary embodiments, the projections 166a-d are merely positioned or affixed along the top side of the cover 168. In another alternative embodiment (not shown), two projections extend across the width, or substantially across the width, of the cover 168 in a parallel or substantially parallel manner. In certain embodiments, the projections are made of one of the following: flat bar, sheet metal, angle iron or rubber. In yet another alternative embodiment, the two projections extend across the width or substantially across the width of the cover 168. In this embodiment, the projections are formed in the cover 168, such as in the forming process. In certain embodiments, the surface shape of the projections molded or formed into the cover or the top layer of the cover 168 include, but are not limited to, hemispherical, triangular, square, rectangular, trapezoidal, or any other shape sufficient to limit horizontal translation of another power box positioned on the cover 168 known to those of ordinary skill in the art.

Figure 2:
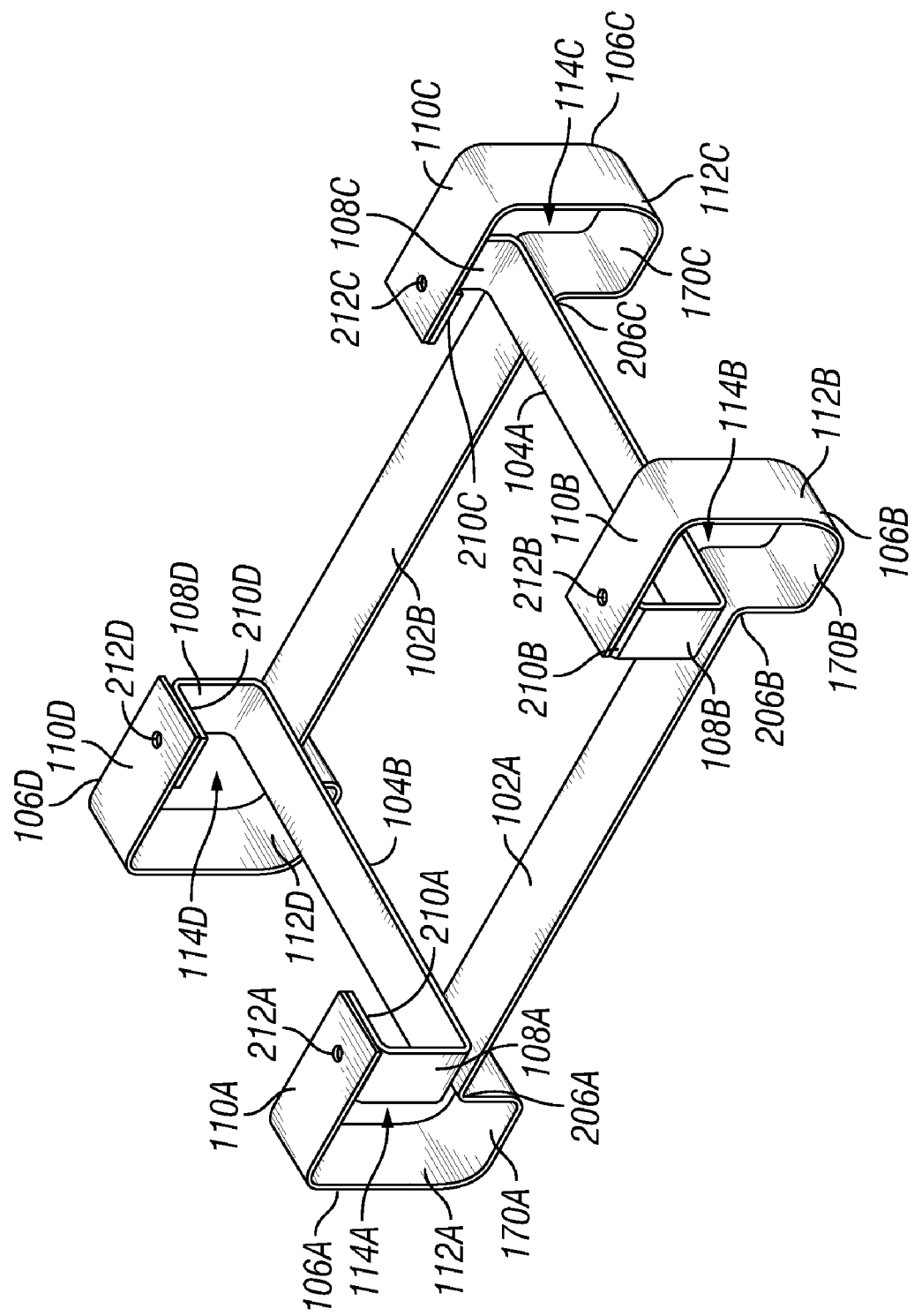
FIG. 2 is a perspective view of the support assembly of FIG. 1 according to one exemplary embodiment of the present invention.

FIG. 2 illustrates an exemplary embodiment of the support assembly 100 of FIG. 1. Referring now to FIGS. 1 and 2, the support assembly 100 includes horizontal longitudinal supports 102a and 102b coupled at distal ends by known coupling methods to distal ends of horizontal latitudinal supports 104a and 104b to form a substantially rectangular configuration. While the exemplary embodiment includes two each of the longitudinal supports 102 and latitudinal supports 104, alternative embodiments can include one or more of each to reduce or increase the overall strength and stability of the support assembly 100. In yet another alternative embodiment, the support assembly 100 is configured without one or both of the longitudinal supports 102 and the latitudinal supports 104. In this alternative embodiment, the feet 170a-d are coupled directly to a side or bottom of the electrical component box 160 of FIG. 1.

Returning to the exemplary embodiment of FIG. 2, vertical members 108a-d are coupled to and extend upward at a substantially orthogonal angle from the distal ends of the latitudinal supports 104a and 104b. In one exemplary embodiment, the vertical members 108a-d are integral with the latitudinal members 104a and 104b and are bent at a substantially orthogonal angle upward from the latitudinal members 104a and 104b. Horizontal coupling members 210a-d are coupled to and extend horizontally inward at a substantially orthogonal angle from the distal ends of vertical members 108a-d respectively. In one exemplary embodiment, the horizontal coupling members 210a-d are integral with one of the latitudinal members 104a and 104b and the vertical members 108a-d respectively and are bent at a substantially orthogonal angle to the respective vertical members 108a-d. In one exemplary embodiment, each of the horizontal coupling members 210a-d include a fastening aperture (not shown) capable of slidably receiving or rotationally receiving a fastener (not shown), such as a bolt or screw, for coupling the support assembly 100 to the bottom side of the electrical component box 160.

Feet 170a-d extend down from the configuration created by the horizontal longitudinal supports 102a and 102b and the horizontal latitudinal supports 104a and 104b. In one exemplary embodiment, each foot 170 is integral with a distal end of one of the horizontal longitudinal supports 102a and 102b. However, those of ordinary skill in the art will recognize that the feet 170a-d could be coupled in numerous manners, including but not limited to being integral with the horizontal latitudinal supports 104a and 104b or being independent of and individually coupled to the horizontal latitudinal supports 104a and 104b and/or the horizontal longitudinal supports 102a and 102b.

Those of ordinary skill in the art will also recognize that the feet 170a-d can be configured in numerous ways that vary their shape an size. For example, the feet 170a-d could have a different surface contact area, such as different shapes and sizes, based on the type of terrain surface in which the power box 150 is intended to be used. Further, in certain exemplary embodiments, the surface contact area on the bottom side of the feet 170a-d can include friction enhancing and/or wear reducing materials, such as rubber, spray-on liners, or other known materials, to reduce the ability of the power box 150 to slide or to increase the durability of the feet 170a-d.

For the exemplary feet 170a-d shown in FIG. 2, the feet 170a-d include vertical members 106a-d that are integral with the horizontal longitudinal supports 102a and 102b. Each vertical member 106a-d initially extends downward at a substantially orthogonal angle from one of the distal ends for the horizontal longitudinal supports 102a and 102b. For ease of description, the point where each vertical member 106a-d extends from its respective horizontal longitudinal support 102a and 102b is called the apex 206a-d. In alternative embodiments, the vertical member can initially angle down from or curve in an arc-like manner down from its respective apex 206a-d with the longitudinal support. Next, each vertical member 106a-d is bent either in a curvilinear or orthogonal manner to provide at least a portion that is substantially horizontal and defines the contact area for the feet 170a-d. Next, each vertical member 106a-d is bent either in a curvilinear or orthogonal manner to extend back into the vertical direction 112a-d. Finally, each vertical member 106a-d is bent either in a curvilinear or orthogonal manner to extend back in the horizontal direction 110a-d towards its respective horizontal coupling member 210a-d. In one exemplary embodiment, each vertical member 106a-d is coupled to it respective horizontal coupling member 210a-d using known coupling methods including, but not limited to, welding.

In one exemplary embodiment, each of the vertical members 106a-d includes a fastening aperture 212a-d capable of slidably receiving or rotationally receiving a fastener (not shown), such as a bolt or screw, for coupling the support assembly 100 to the bottom side of the electrical component box 160. While the vertical members 106a-d have been described as a unitary piece that is integral with the horizontal longitudinal supports 102a and 102b, those of ordinary skill in the art recognize that the vertical members 106a-d can be manufactured from multiple parts, each either being integral with or separate from the horizontal longitudinal supports 102a and 102b. Those of ordinary skill in the art will also recognize that the shape of the vertical members 106a-d is easily modifiable based on the needs and expected uses of the power box 150. Further, the coupling of the vertical members to respective horizontal coupling members 210a-d form apertures 114a-d. In one exemplary embodiment, the apertures 114a-d are positioned and dimensioned to receive devices used for lifting and transporting the power box 150 including, but not limited to a fork of a forklift truck. The fork is capable of passing through one or more of the apertures 114a-d to then lift the power box 150 and move it as needed.

FIG. 1 is a perspective view of a power box 150 according to one exemplary embodiment of the present invention. In one exemplary embodiment, the support assembly 100 and the power box 150 are substantially rectangular; however, other known shapes are within the scope of the present invention. The support assembly 100 is configured to act as the legs of the power box 150 and raises the power box 150 off of the ground to prevent dirt and other contaminants from damaging the power box 150. Additionally, the support assembly 100 provides the stability and strength to resist typical loads associated with the power box 150. The support assembly 100 comes in various configurations. In the exemplary embodiment of FIG. 1, the support assembly 100 includes at least one horizontal longitudinal support 102, at least one horizontal latitudinal support 104, and vertical members 106a-d that form feet 170a-d that are coupled to and extend down from the bottom side of the box 160.

In one exemplary embodiment, the longitudinal dimension 172 of the innermost boundary of the feet 170a-d is equal to or greater than the latitudinal dimension 184 of the cover 168. In this exemplary embodiment, the dimension of the outer width 164 is less than or equal to the longitudinal distance 186 between the projections 166. The difference in the dimensions between the feet 172 and the latitudinal dimension of the cover 184 facilitates stacking of the power boxes 150 upon one-another. In an alternative embodiment, the longitudinal dimension 172 of the innermost boundary of the feet 170a-d is equal to or greater than the longitudinal dimension 182 of the cover 168. In this alternative embodiment, the dimension of the outer width 164 is less than or equal to the latitudinal distance 188 between the projections.

Figure 4:
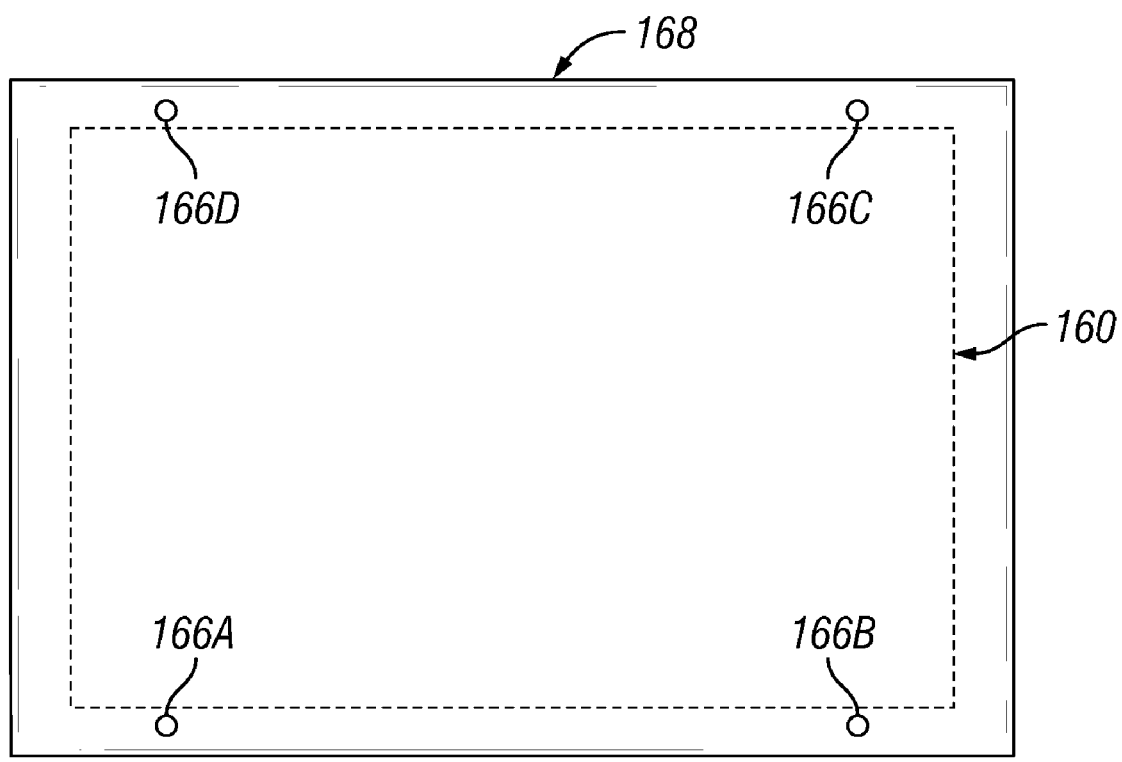
FIG. 4 is a top view of the power box of FIG. 1 according to one exemplary embodiment of the present invention.

FIG. 4 illustrates a top view of the cover 168 of the power box 150 according to the exemplary embodiment of FIG. 1. Referring now to FIGS. 1-4, the cover 168 includes the four projections 166a-d. While the projections 166a-d are shown in a rectangular shape in the exemplary embodiment, other shapes and or lines of projections can be substituted in an alternative embodiment, based on the shape, dimensions, and likelihood of the power box 150 and its support assembly 100 to slide. In certain exemplary embodiments, the top surface of the cover 168 includes rubber or other materials including, but not limited to spray-on liners, to enhance friction and to increase the durability of the top surface of the cover 168. The cover 168 may be an after market modification of the power box 150 used to integrate a previously existing electrical component box 160 into the disclosed power box 150.

Figure 5:
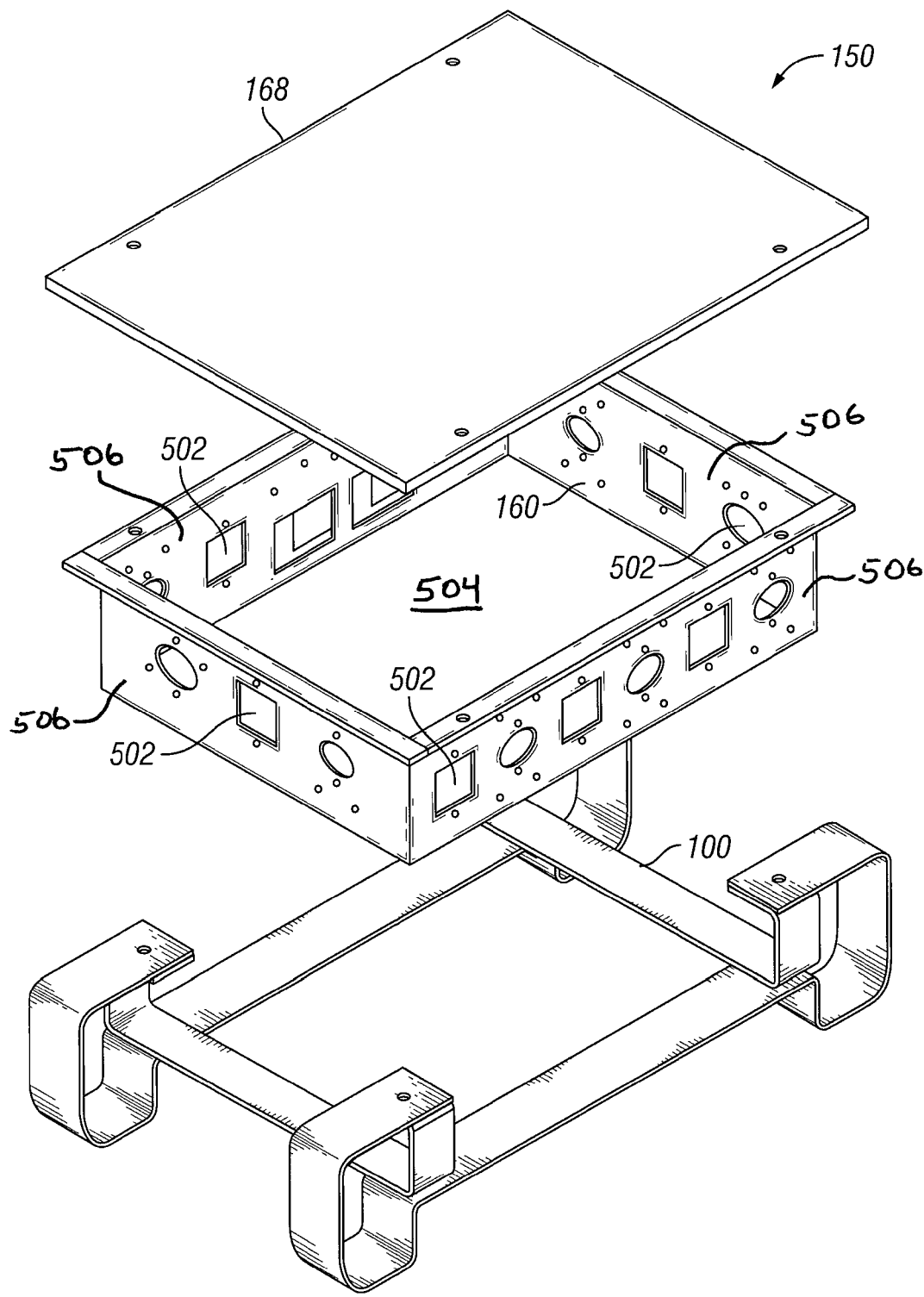
FIG. 5 is an exploded view of the power box of FIG. 1 according to one exemplary embodiment of the present invention.

FIG. 5 illustrates an exploded view of a power box 150 according to the exemplary embodiment of FIG. 1. Referring now to FIGS. 1-5, the exemplary power box 150 generally includes three components: the support assembly 100, the electrical component box 160, and the cover 168. In one exemplary embodiment, the cover 168 is coupled to the top portion of the electrical component box 160 using known coupling methods and materials including, but not limited to, screws or nuts and bolts. The bottom portion of the electrical component box 160 includes a bottom member or side 504 that is coupled to the support assembly 100 using known coupling methods and materials including, but not limited to, bolts and nuts. As described above, the electrical component box 160 includes a plurality of vertical side walls 506 that extend downward from the cover 168 and are coupled to the bottom member 504. Each vertical side wall 506 can provide multiple receptacles 502 for receiving plugs from and providing power to a variety of electrically powered tools that are used on a construction site. For example, the electrical component box 160 can be configured to receive power from a single source and supply that power to multiple devices through the receptacles 502. The electrical component box 160 can even be provided with known components that allow it to provide power at multiple voltages, frequencies, and/or currents from the same box. For example, the electrical component box 160 can include individual ground fault circuit interrupter modules, stab termination circuit breakers, multiple straight blade or twist-lock outlet receptacles and a high amp inlet receptacle. Each of these components can include gasketed or non-gasketed lift covers to protect the component from dirt and/or moisture while not in use.

Figure 6A:
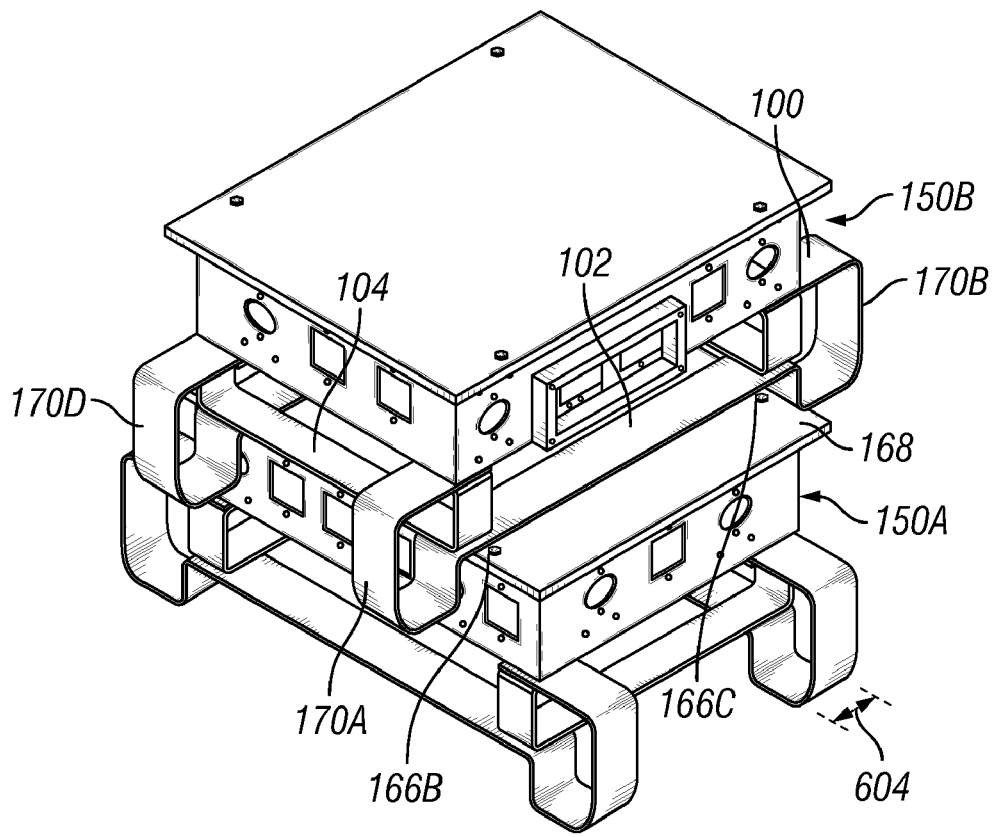
FIG. 6A is a perspective view of a first power box and a second power box stacked together according to one exemplary embodiment of the present invention.
Figure 6B:
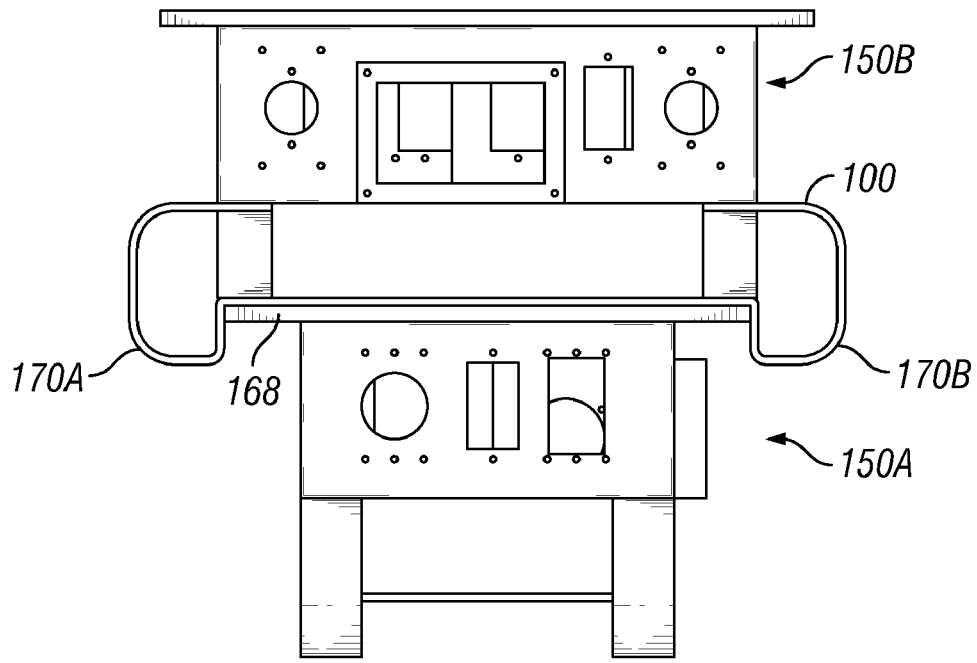
FIG. 6B is a front elevation view of the stacked power boxes of FIG. 6A according to one exemplary embodiment of the present invention.

A feature utilized by one or more exemplary embodiments of the power box 150 is nesting. Nesting utilizes the shape and individual dimensions of the support assembly 100 or electrical component box 160 and the cover 168 to allow stacking of multiple power boxes 150 in a way that limits horizontal translation of the power boxes 150 in the stacked configuration. FIGS. 6A and 6B illustrate views of an exemplary stacking arrangement of the power boxes 150 according to one exemplary embodiment of the present invention. Referring now to FIGS. 1-6B, the exemplary power box 150 includes a ventral region defined by the hollow area formed by the vertical members 106*a-d* of the support assembly 100. The dimensions of the ventral region allow at least a portion of the cover 168 of a first power box 150*a* to enter the ventral region of a second power box 150*b*.

As shown in FIGS. 6A-B, in one exemplary embodiment, prior to stacking the second power box 150*b* on top of the first power box 150*a*, the second power box 150*b* is rotated at or substantially near to ninety degrees with respect to the first power box 150*a*. When the second power box 150*b* is placed on top of the first power box 150*a* at the substantially ninety degree offset, outer width 164 of the support assembly 100 fits between projections 166*b* and 166*a* (not shown) and between projections 166*c* and 166*d* (not shown), such that the horizontal longitudinal supports 102 and the horizontal latitudinal supports 104 of the second power box 150*b* rest flat or substantially flat along the upper surface of the cover 168 of the first power box 150*a*.

As shown in FIG. 6A, the feet 170*a-d* of the second power box 150*b* extend below the upper surface of the cover 168 of the first power box 150*a*, causing the weight of the second power box 150*b* to be distributed by the horizontal longitudinal supports 102 and horizontal latitudinal supports 104 of the second power box 150*b* along the upper surface of the cover 168 of the first power box 150*a*. In this embodiment, if the second power box 150*b* were to try to horizontally slide or translate along a first axis 602, translation would be prevented by the horizontal longitudinal supports 102 of the second power box 150*b* impacting and being contained by either projections 166*b* and 166*c* or projections 166*a* and 166*d* (not shown) On the other hand, if the second power box 150*b* were to try to horizontally translate along a second axis 604, translation would be prevented by the feet 170*a* and 170*d* or 170*b* and 170*c* of the second power box 150*b* impacting an edge of the cover 168 of the first power box 150*a*, depending on the direction the box 150*b* is trying to slide. In another alternative embodiment, horizontal translation along the second axis 604 is prevented by the portion of the vertical members 106*a-d* adjacent the apex 206*a-d* that extends below the horizontal longitudinal support 102. In this embodiment, the curve or angle of each vertical member 106*a-d* adjacent the apex 206 impacts the edge of the cover 168 of the first power box 150*a* to prevent horizontal translation. Further, as discussed above, the upper surface of the cover 168 of the power box 150 can include friction enhancing and/or wear reducing materials, such as rubber, spray-on liners, or other known materials, to further reduce the ability of the second power box 150*b* to slide along the upper surface of the cover 168 of the first power box 150*a*. This stacking process is capable of being repeated such that three or more power boxes 150 are stacked vertically as desired.

Figure 7A:
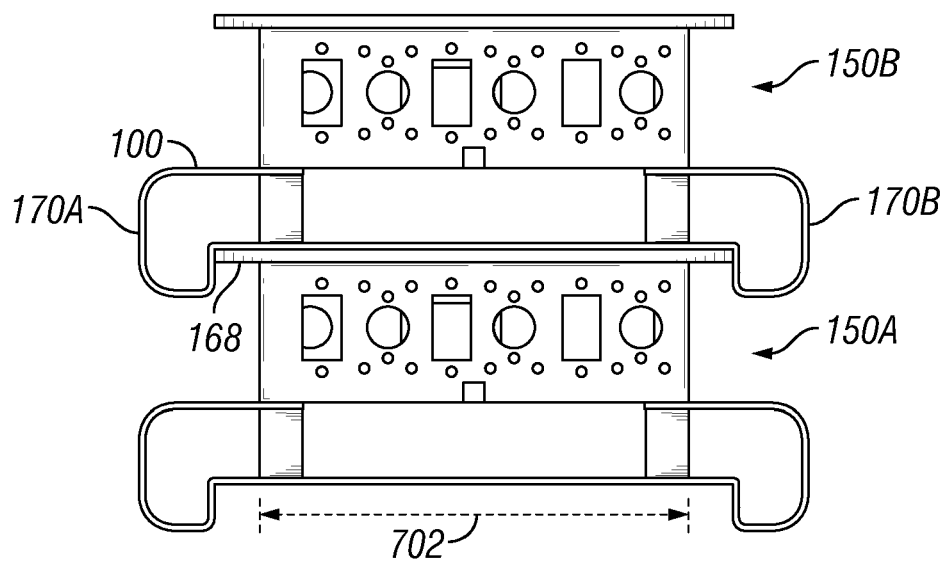
FIG. 7A is a perspective view of another stacking arrangement for the first power box and the second power box according to an alternative exemplary embodiment of the present invention.
Figure 7B:
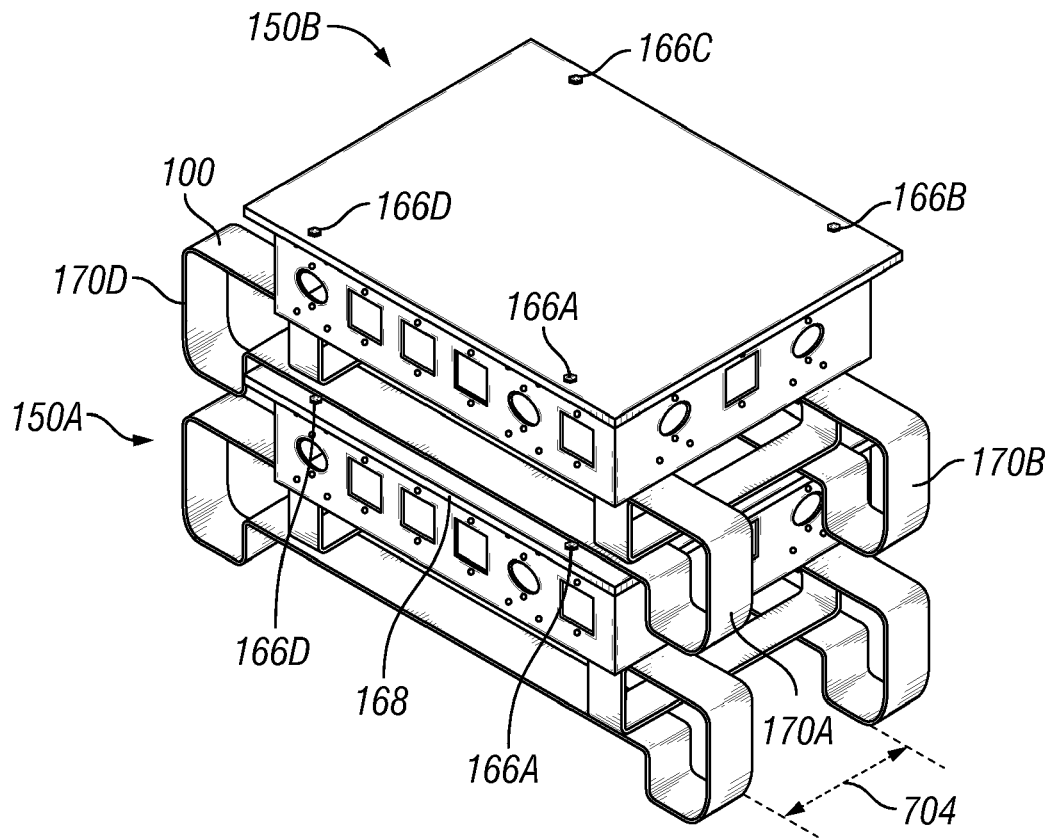
FIG. 7B is a front elevation view of the alternative stacking arrangement of FIG. 7A according to the alternative exemplary embodiment of the present invention.

FIGS. 7A and 7B illustrate views of an alternative in-line stacking arrangement of the power boxes 150 according to one exemplary embodiment of the present invention. Referring now to FIGS. 1-5, 7A and 7B, in the alternative arrangement, the power boxes 150*a* and 150*b* are in-line instead of being off-set as with the example shown in FIGS. 6A and 6B. In this alternative embodiment, the longitudinal dimension 172 of the innermost boundary of the feet 170*a-d* is equal to or greater than the longitudinal dimension of the cover 168, as discussed in reference to FIG. 3. When the second power box 150*b* is placed in a resting position on top of the first power box 150*a*, the feet 170*a-d* of the second power box 150*b* extend below the upper surface of the cover 168 of the first power box 150*a* in a similar fashion as described in reference to FIGS. 6A and 6B. The weight of the second power box 150*b* is distributed by the horizontal longitudinal supports 102 and horizontal latitudinal supports 104 of the second power box 150*b* along the upper surface of the cover 168 of the first power box 150*a*. In this alternative embodiment, if the second power box 150*b* were to try to horizontally translate along a first axis 702, translation would be prevented by the feet 170*a* and 170*b* or 170*c* and 170*d* of the second power box 150*b* impacting an edge of the cover 168 of the first power box 150*a*, depending on the direction the box 150*b* is trying to slide.

On the other hand, if the second power box 150*b* was trying to horizontally translate along a second axis 704, the translation would be prevented by the horizontal longitudinal supports 102 of the second power box 150*b* impacting and being contained by either projections 166*a* and 166*b* or 166*c* and 166*d* (not shown). In another alternative embodiment, horizontal translation along the first axis 702 is prevented by the portion of each vertical member 106*a-d* adjacent the apex 206*a-d* that extends below horizontal longitudinal support 102. In this embodiment, the curve or angle of each vertical member 106*a-d* adjacent the apex 206 impacts the edge of the cover 168 of the first power box 150*a* to prevent horizontal translation. Further, as discussed above, the upper surface of the cover 168 of the power box 150 can include friction enhancing and/or wear reducing materials, such as rubber, spray-on liners, or other known materials, to further reduce the ability of the second power box 150*b* to slide along the upper surface of the cover 168 of the first power box 150*a*. This alternative stacking process is capable of being repeated such that three or more power boxes 150 are stacked vertically as desired.

As described herein, the present invention is well adapted to attain the ends and advantages mentioned, as well as those inherent therein. The particular embodiments above are illustrative only, as the present invention may be modified and practiced in different but equivalent manners apparent to those having ordinary skill in the art having the benefit of the teachings provided herein. Having described some exemplary embodiments of the present invention, it is believed that the use of alternate inputs connectors or output connectors is within the purview of those having ordinary skill in the art.

While numerous changes may be made by those having ordinary skill in the art, such changes are encompassed within the spirit and scope of this invention as defined by the appended claims. Furthermore, no limitations are intended by the exemplary details of construction or design herein shown, other than as described in the claims below. It is therefore evident that the particular illustrative embodiments disclosed above may be altered or modified and all such variations are considered within the scope and spirit of the present invention. The terms in the claims have their plain, ordinary meaning unless otherwise explicit and clearly defined herein.

What is claimed is:

1. A power distribution box comprising:
an electrical component box comprising:
a top side defined by an aperture;
a plurality of walls extending down from the top side; and
a bottom member coupled to the plurality of walls; and
wherein the electrical component box further comprises a first and a second horizontal dimension
a plurality of feet coupled to the bottom member, wherein at least a portion of the plurality of feet extend below the bottom member of the electrical component box; and
a cover disposed above and coupled to the top side of the electrical component box, the cover having a longitudinal horizontal dimension and a latitudinal horizontal dimension and further comprising:
a top surface;
a bottom surface opposite the top surface; and
a plurality of projections extending vertically upward from the top surface;
wherein at least two of the plurality of projections are spaced-apart a first distance;
wherein the first distance is greater than at least one of a group consisting of the first horizontal dimension and the second horizontal dimension of the electrical component box; and
wherein a longitudinal dimension of the innermost boundary of two of the plurality of feet is greater than the latitudinal horizontal dimension of the cover.

2. The power distribution box of claim 1, further comprising friction enhancing material disposed along the top surface of the cover.

3. The power distribution box of claim 1, wherein the electrical component box further comprises a plurality of electrical receptacles disposed in the plurality of walls along a perimeter of the box.

4. The power distribution box of claim 1, wherein the cover comprises the longitudinal horizontal dimension and a latitudinal horizontal dimension, wherein the longitudinal horizontal dimension of the cover is greater than or equal to the first horizontal dimension of the component box and the latitudinal horizontal dimension is greater than or equal to the second horizontal dimension of the electrical component box.

5. The power distribution box of claim 1, wherein the plurality of projections couple the cover to the top side of the electrical component box.

6. The power distribution box of claim 1, wherein the plurality of projections comprise bolt heads.

7. The power distribution box of claim 1, wherein the feet comprise an aperture dimensioned to receive a device for lifting the electrical component box.

8. The power distribution box of claim 7, wherein the aperture in each of the plurality of feet is dimensioned to receive a fork for a forklift truck.

9. A power distribution box comprising:
an electrical component box comprising:
a cover comprising a top surface and a bottom surface, wherein the top surface comprises a plurality of projections extending upward from the top surface;
a plurality of vertical walls extending upward from a bottom member; and
the bottom member coupled to the vertical walls, wherein the walls, bottom member and cover define an interior volume of the electrical component box;
a support assembly having a horizontal longitudinal dimension and a horizontal latitudinal dimension, the assembly comprising:
a top side:
a bottom side; and
a plurality of feet extending down from the bottom side of the support assembly;
wherein the support assembly is coupled to the electrical component box;
wherein at least two of the plurality of projections are spaced-apart a first distance, the first distance being greater than or equal to the latitudinal dimension of the support assembly.

10. The power distribution box of claim 9, wherein the support assembly further comprises:
at least one horizontal latitudinal member comprising a first distal end and a second distal end opposite the first;
a first horizontal longitudinal member disposed substantially orthogonal to the horizontal latitudinal member and coupled to the first distal end; and
a second horizontal longitudinal member disposed substantially orthogonal to the horizontal latitudinal member and coupled to the second distal end.

11. The power distribution box of claim 10,
wherein the plurality of feet comprises four feet;
wherein the first horizontal longitudinal member comprises a first distal end and a second distal end opposite the first;
wherein the second horizontal longitudinal member comprises a first distal end and a second distal end opposite the first; and
wherein a first foot of the plurality of feet extends downward from the first distal end of the first horizontal longitudinal member;
wherein a second foot of the plurality of feet extends downward from the second distal end of the first horizontal longitudinal member;
wherein a third foot of the plurality of feet extends downward from the first distal end of the second horizontal longitudinal member; and
wherein a fourth foot of the plurality of feet extends downward from the second distal end of the second horizontal longitudinal member.

12. The power distribution box of claim 9, further comprising friction enhancing material disposed along the top surface of the cover.

13. The power distribution box of claim 9, wherein the electrical component box further comprises a plurality of electrical receptacles disposed along the plurality of vertical walls of the electrical component box.

14. A method of stacking power distribution boxes comprising the steps of:
providing a first and a second power distribution box each comprising:
an electrical component box comprising:
bottom member;
a plurality of side walls coupled to the bottom member and extending generally upward from the bottom member; and
a cover disposed over the plurality of side walls, wherein the cover comprises a plurality of projections extending up from a top surface of the cover;
a support assembly coupled to the electrical component box and having a horizontal longitudinal dimension and a horizontal latitudinal dimension, the assembly comprising a plurality of feet extending down from the support assembly the plurality of feet defining a ventral region;

wherein at least two of the plurality of projections are spaced-apart a first distance, the first distance being greater than or equal to the latitudinal dimension of the support assembly;

positioning the first power distribution box on a surface;

positioning the second power distribution box at a substantially ninety degree offset from the first power distribution box; and positioning the second power distribution box on top of the first power distribution box;

wherein at least a portion of the support assembly of the second power distribution box is positioned upon the upper surface of cover of the first power distribution box; and wherein the portion of the support assembly is positioned between the at least two projections spaced-apart a first distance to substantially prevent horizontal movement by the second power distribution box in a first direction.

15. The method of claim 14, wherein the cover of the first power distribution box is slidably positioned into the ventral region of the second power distribution box to substantially prevent horizontal movement by the second power distribution box in a second direction, the second direction being substantially orthogonal to the first direction.

16. The method of claim 15, wherein movement in the second direction is substantially prevented by at least one foot of the second power distribution box contacting the cover of the first power distribution box.

* * * * *